US011535750B2

(12) United States Patent
Moon et al.

(10) Patent No.: US 11,535,750 B2
(45) Date of Patent: Dec. 27, 2022

(54) THERMOSETTING RESIN COMPOSITION FOR SEMICONDUCTOR PACKAGE AND PREPREG AND METAL CLAD LAMINATE USING THE SAME

(71) Applicant: LG CHEM, LTD., Seoul (KR)

(72) Inventors: Hwa Yeon Moon, Daejeon (KR); Jung Jin Shim, Daejeon (KR); Hee Yong Shim, Daejeon (KR); Hyun Sung Min, Daejeon (KR); Mi Seon Kim, Daejeon (KR); Chang Bo Shim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 638 days.

(21) Appl. No.: 14/901,895

(22) PCT Filed: Sep. 25, 2014

(86) PCT No.: PCT/KR2014/008974
§ 371 (c)(1),
(2) Date: Dec. 29, 2015

(87) PCT Pub. No.: WO2015/046921
PCT Pub. Date: Apr. 2, 2015

(65) Prior Publication Data
US 2016/0369099 A1    Dec. 22, 2016

(30) Foreign Application Priority Data

Sep. 30, 2013 (KR) .................. 10-2013-0116771
Sep. 25, 2014 (KR) .................. 10-2014-0128140

(51) Int. Cl.
| C08L 79/04 | (2006.01) |
| H01L 23/498 | (2006.01) |
| H05K 1/03 | (2006.01) |
| H01L 21/48 | (2006.01) |
| C08K 3/22 | (2006.01) |
| C08L 61/04 | (2006.01) |
| C08L 79/08 | (2006.01) |
| C08K 3/34 | (2006.01) |
| C08J 5/24 | (2006.01) |
| H05K 3/02 | (2006.01) |

(52) U.S. Cl.
CPC .............. *C08L 79/04* (2013.01); *C08J 5/244* (2021.05); *C08J 5/249* (2021.05); *C08K 3/22* (2013.01); *C08K 3/34* (2013.01); *C08L 61/04* (2013.01); *C08L 79/08* (2013.01); *H01L 21/4846* (2013.01); *H01L 23/49894* (2013.01); *H05K 1/0373* (2013.01); *C08J 2379/04* (2013.01); *C08J 2379/08* (2013.01); *C08J 2463/00* (2013.01); *C08J 2479/04* (2013.01); *C08L 2203/20* (2013.01); *C08L 2205/025* (2013.01); *C08L 2205/035* (2013.01); *H05K 1/0366* (2013.01); *H05K 3/022* (2013.01)

(58) Field of Classification Search
CPC .............. C08J 2379/04; C08J 2379/08; C08J 2463/00; C08J 2479/04; C08J 5/24; C08J 2363/02; C08J 2363/04; C08J 2363/10; C08J 2479/02; C08K 3/22; C08K 3/34; C08K 7/18; C08K 9/06; C08L 2203/20; C08L 2205/025; C08L 2205/035; C08L 61/04; C08L 63/00; C08L 79/04; C08L 79/08; C08L 61/34; H01L 21/4846; H01L 23/145; H01L 23/49894; H05K 1/0366; H05K 1/0373; H05K 3/022; B32B 15/04; B32B 2260/046; B32B 2307/306; B32B 2307/714; C08G 14/06; C08G 73/0655
See application file for complete search history.

(56) References Cited

U.S. PATENT DOCUMENTS

| 4,022,755 A * | 5/1977 | Tanigaichi ............... C08G 8/28 |
| | | 525/504 |
| 6,337,375 B1 | 1/2002 | Johansson et al. |
| 7,842,401 B2 | 11/2010 | Chen |
| 2010/0249279 A1 | 9/2010 | Ogawa et al. |
| 2011/0083890 A1 | 4/2011 | Tanaka et al. |
| 2011/0223383 A1 * | 9/2011 | Goto ..................... C08G 59/621 |
| | | 428/141 |
| 2011/0247756 A1 * | 10/2011 | Wilson ............... C08G 59/4014 |
| | | 156/307.7 |

(Continued)

FOREIGN PATENT DOCUMENTS

| CN | 102040803 A | 5/2011 |
| CN | 102134375 A | 7/2011 |

(Continued)

OTHER PUBLICATIONS

Koshibe, Machine translation of Jp 2003/026957A. Jan. 29, 2003.*
Dianal American, Inc., Viscosity Conversion Table. Retrieved on Aug. 13, 2019. (Year: 2019).*
Huntsman, Advanced Materials—Raise performance with building blocks. (Year: 2012).*
Ru et al, CN10381506B machine translation. May 2012. (Year: 2012).*
Search Report issued for International Application No. PCT/KR2014/008974 dated Jan. 14, 2015 (2 pages).

*Primary Examiner* — Michael B Nelson
(74) *Attorney, Agent, or Firm* — Rothwell, Figg, Ernst & Manbeck, P.C.

(57) ABSTRACT

There are provided a thermosetting resin composition for a semiconductor package and a prepreg and a metal clad laminate using the same. More particularly, there are provided a thermosetting resin composition for a semiconductor package capable of improving desmear characteristics by using a cyanate based ester resin and a benzoxazine resin in a thermosetting resin composition based on an epoxy resin and improving chemical resistance by using a slurry type filler to have high heat resistance and reliability, and a prepreg and a metal clad laminate using the same.

8 Claims, No Drawings

(56) References Cited

U.S. PATENT DOCUMENTS

| | | | |
|---|---|---|---|
| 2012/0077401 A1 | 3/2012 | Kotake et al. | |
| 2012/0111621 A1 | 5/2012 | Ohigashi et al. | |
| 2012/0276392 A1* | 11/2012 | Takahashi | B32B 15/08 428/418 |
| 2013/0075138 A1 | 3/2013 | Yu et al. | |
| 2013/0105200 A1* | 5/2013 | Ohigashi | C08J 5/24 174/250 |
| 2013/0319609 A1 | 12/2013 | Shim et al. | |

FOREIGN PATENT DOCUMENTS

| | | | |
|---|---|---|---|
| CN | 101381506 B | * | 5/2012 |
| CN | 102482481 A | | 5/2012 |
| CN | 103298882 A | | 9/2013 |
| JP | 2002-285003 A | | 10/2002 |
| JP | 2003026957 A | * | 1/2003 |
| JP | 2007-169454 A | | 7/2007 |
| JP | 2009-280758 A | | 12/2009 |
| JP | 2010-150407 A | | 7/2010 |
| JP | 2010-229227 A | | 10/2010 |
| JP | 2010-235806 A | | 10/2010 |
| JP | 2011-157509 A | | 8/2011 |
| JP | 2011-202140 A | | 10/2011 |
| JP | 2013-071940 A | | 4/2013 |
| KR | 10-0335304 B1 | | 4/2002 |
| KR | 10-2010-0088567 A | | 8/2010 |
| KR | 10-2010-0121552 A | | 11/2010 |
| KR | 10-1021047 B1 | | 3/2011 |
| KR | 10-2012-0012782 A | | 2/2012 |
| KR | 10-2012-0050433 A | | 5/2012 |
| KR | 10-2012-0101090 A | | 9/2012 |
| KR | 10-2012-0123031 A | | 11/2012 |
| KR | 10-2013-0011972 A | | 1/2013 |
| WO | 2010/110433 A1 | | 9/2010 |
| WO | 2013-015469 A1 | | 1/2013 |

* cited by examiner

THERMOSETTING RESIN COMPOSITION FOR SEMICONDUCTOR PACKAGE AND PREPREG AND METAL CLAD LAMINATE USING THE SAME

CROSS REFERENCE TO RELATED APPLICATIONS

This application is a 35 U.S.C. § 371 National Phase Entry Application from PCT/KR2014/008974, filed Sep. 25, 2014, and designating the United States, which claims priority under 35 U.S.C. § 119 to Korean Patent Application No. 10-2013-0116771 filed on Sep. 30, 2013, and Korean Patent Application No. 10-2014-0128140 filed on Sep. 25, 2014, which are incorporated herein by reference in their entireties.

TECHNICAL FIELD

The present invention relates to a thermosetting resin composition capable of improving desmear property of a printed circuit board (PCB) for a semiconductor package, and a prepreg and a metal clad laminate using the same.

BACKGROUND

A copper clad laminate used in a printed circuit board according to the related art is manufactured by impregnating a glass fabric substrate with thermosetting resin varnish, semi-curing the substrate to form a prepreg, and then pressurizing and heating the prepreg together with copper foil. The prepreg is used again for configuring and building up a circuit pattern on this copper clad laminate.

However, drilling work is performed for electric signals during a manufacturing process of the printed circuit board, but during the drilling work, that resins are melted by heat, such that smear, which is a waste covering an inner layer and holes, is generated.

The smear may cause problems such as water absorption, electricity connection failure, or the like. Therefore, a process of removing the resin melted to a bottom using a strong alkaline aqueous solution, plasma, or the like, is performed. This process is referred to as a desmear process. However, since an existing resin composition is made of an epoxy resin, or the like, having weak chemical resistance, the existing resin composition may be weak against the desmear process.

Further, in accordance with thinness and lightness of electronic devices, a semiconductor package has also been thinned and highly densified. However, in accordance with thinness and high densification of the semiconductor package, a warpage phenomenon that the package is warped occurs. In order to minimize this warpage phenomenon, the copper clad laminate used in the package should have a low coefficient of thermal expansion (CTE). To this end, there is a method of using a large amount of an inorganic filler having a low CTE to allow the copper clad laminate to have a low CTE. However, the larger the amount of the inorganic filler, the poorer the drilling processability, such that the desmear process becomes important.

Therefore, a thermosetting resin composition capable of having a low CTE property and facilitating the desmear process to improve workability of a manufacturing process of a printed circuit board should be developed.

DISCLOSURE

Technical Problem

The present invention has been made in an effort to provide a thermosetting resin composition for a semiconductor package having excellent drilling processability, in order to improve the problem of poor desmear characteristics in a manufacturing process of a printed circuit board.

In addition, the present invention has been made in an effort to provide a prepreg using the thermosetting resin composition, having high thermal resistance and high reliability, and a metal clad laminate including the prepreg.

Technical Solution

An exemplary embodiment of the present invention provides a thermosetting resin composition for a semiconductor package containing: a resin composition containing a binder containing an epoxy resin and a bismaleimide based resin, and a benzoxazine resin; and a slurry type filler, wherein the benzoxazine resin is contained at a content of 10 wt % or less based on a total weight of the entire resin composition.

The slurry type filler may be contained at a content of 160 to 350 parts by weight based on 100 parts by weight of the resin composition. In addition, the benzoxazine resin may be contained at a content of 2 to 10 wt % based on the total weight of the entire resin composition.

The binder may contain 20 to 80 wt % of the epoxy resin and 20 to 80 wt % of the bismaleimide based resin.

The binder may further contain a cyanate based ester resin. In this case, the binder may contain 20 to 60 wt % of the epoxy resin, 30 to 70 wt % of the cyanate based ester resin, and 20 to 70 wt % of the bismaleimide based resin.

As the slurry type filler, it is preferable that slurry containing at least one inorganic filler selected from the group consisting of silica, aluminum trihydrate, magnesium hydroxide, molybdenium oxide, zinc molybdate, zinc borate, zinc stannate, alumina, clay, kaolin, talc, calcined kaolin, calcined talc, mica, glass short fiber, glass fine powder, and hollow glass is used.

The epoxy resin may be at least one selected from the group consisting of a bisphenol A type epoxy resin, a bisphenol F type epoxy resin, a bisphenol S type epoxy resin, a novolac type epoxy resin, a phenol novolac epoxy resin, a cresol novolac type epoxy resin, a tetraphenyl ethane type epoxy resin, a naphthalene type epoxy resin, a biphenyl type epoxy resin, and a dicyclopentadienyl type epoxy resin.

The bismaleimide based resin may be at least one selected from the group consisting of a bismaleimide-triazine (BT) resin, 4,4'-bismaleimido-diphenylmethane, 1,4-bismaleimido-2-methylbenzene, or a mixture thereof; a modified bismaleimide resin including a Diels-Alder comonomer; a 4,4'-bismaleimido-diphenylmethane and allylphenyl compound; and partially advanced bismaleimide using an aromatic amine as a substrate. In addition, the Diels-Alder comonomer may be selected from the group consisting of styrene and styrene derivatives, bis(propenylphenoxy) compounds, 4,4'-bis(propenylphenoxy)sulfone, 4,4'-bis(propenylphenoxy)benzophenone, and 4,4'-1-(1-methylethylidene)bis(2-(2-propenyl)phenol).

The cyanate based ester resin may be at least one selected from the group consisting of bisphenol A type, bisphenol F type, bisphenol E type, bisphenol H type, bisphenol N type, phenol novolac type, and dicyclopentadiene bisphenol type cyanate based ester resins.

The thermosetting resin composition may further contain at least one additive selected from the group consisting of a solvent, a curing accelerator, a dispersant, and silane coupling agent.

Another exemplary embodiment of the present invention provides a prepreg prepared by impregnating the thermosetting resin composition as described above into a fabric substrate.

Another exemplary embodiment of the present invention provides a metal clad laminate including the prepreg as described above; and metal foil integrated with the prepreg by heating and pressurizing.

Advantageous Effects

The thermosetting resin composition according to the present invention may have excellent physical properties by using the cyanate resin as well as the epoxy resin, and the bismaleimide based resin may be cured by using benzoxazine resin instead of the existing phenolic curing agent. Therefore, according to the present invention, at the time of drilling working, generation of smear by heat is suppressed as compared to the related art, thereby providing excellent desmear characteristics. In addition, the thermosetting resin composition according to the present invention uses the slurry type filler unlike the related art, the thermosetting resin composition may have high heat resistance and reliability and improved chemical resistance while having physical properties that are equal to or more excellent than those of the existing thermosetting resin composition. Therefore, the present invention may provide the prepreg and the metal clad laminate having excellent chemical resistance.

Best Mode

Hereinafter, a thermosetting resin composition according to an exemplary embodiment of the present invention will be described in detail.

According to an exemplary embodiment of the present invention, there is a provided a thermosetting resin composition for a semiconductor package containing: a resin composition containing a binder containing an epoxy resin and a bismaleimide based resin, and a benzoxazine resin; and a slurry type filler, wherein the benzoxazine resin is contained at a content of 10 wt % or less based on a total weight of the entire resin composition.

In addition, the slurry type filler may be contained at a content of 160 to 350 parts by weight based on 100 parts by weight of the resin composition. In addition, it is preferable that the benzoxazine resin is contained at a content of 2 to 10 wt % based on the total weight of the entire resin composition.

The thermosetting resin composition according to the present invention uses the benzoxazine resin instead of an existing phenol curing agent to induce the curing of the bismaleimide based resin and uses the slurry type filler, thereby making it possible to increase interfacial adhesion between the resin and the filler to improve chemical resistance. Further, in the composition according to the present invention, more excellent physical properties may by implemented by using a cyanate based ester resin.

In addition, according to the related art, the benzoxazine resin was used mainly for flame retardancy, but in this case, a content thereof is inevitably high, which causes deterioration of physical properties. Further, due to characteristics of the benzoxazine resin as the curing agent, when the content of the benzoxazine resin is increased, it is impossible to increase a content of the filler.

However, according to the present invention, the content of the benzoxazine resin used as the curing agent in the thermosetting resin composition is low (10 wt % or less), such that it is possible to implement chemical resistance and a high glass transition temperature (Tg) and increase the content of the filler.

Therefore, the thermosetting resin composition according to the present invention may improve chemical resistance to improve desmear characteristics. The thermosetting resin composition according to the present invention having the above-mentioned characteristics, and a prepreg and a metal clad laminate using the thermosetting resin composition may be applied to manufacture a multilayer printed circuit board as well as a double sided printed circuit board.

Hereinafter, ingredients of the thermosetting resin composition according to the present invention will be described in more detail.

The thermosetting resin composition according to the present invention may contain a binder ingredient containing an epoxy resin and a special resin and a filler, and also contain a curing agent.

In this case, the present invention is characterized in that the benzoxazine resin is used as the curing agent at a specific content, and the slurry type filler is used based on the content of the benzoxazine resin.

According to the present invention, the benzoxazine resin is used at a content of 10 wt % or less, more preferably 2 to 10 wt % based on the total weight of the entire resin composition so that the curing of the bismaleimide based resin contained in the binder may be sufficiently induced. In the case in which the content of the benzoxazine resin is more than 10 wt %, physical properties may be further deteriorated, such that it is impossible to implement excellent chemical resistance and have high glass transition temperature (Tg). That is, in the case in which the benzoxazine resin is excessively contained, at the time of preparing the prepreg, a curing reaction rate is excessively fast, such that process efficiency may be deteriorated. Further, in the case in which the content of the benzoxazine resin is excessively low (less than 2 wt %), the desired curing effect may not be exhibited, such that it is impossible to improve chemical resistance and the glass transition temperature (Tg).

In the case of the benzoxazine resin used in the present invention, a reaction rate thereof may be adjusted, such that flowability of the resin may be improved, thereby making it possible to secure flowability of the prepreg. In addition, the benzoxazine resin may enable the curing of the bismaleimide based resin as described above.

That is, the benzoxazine resin may be used as the curing agent for the bismaleimide based resin. According to the present invention, as the benzoxazine resin is used as the curing agent of the bismaleimide based resin, flowability of the resin may be improved, and the resin may be completely cured even under a low temperature condition. Therefore, in the case of using the resin composition to prepare a prepreg, a prepreg having a high glass transition temperature under low temperature and pressurized conditions may be provided.

Further, the benzoxazine resin is used as the curing agent of the bismaleimide based resin, such that a rate of a curing reaction of the epoxy resin may be relatively decreased. Therefore, at the time of preparing the prepreg, time for sufficiently impregnating the resin composition into a fabric substrate may be secured, and an appearance defect may be minimized.

In addition, it is preferable in view of securing a curing effect and mechanical properties that the benzoxazine resin has a weight average molecular weight of 200 to 400.

Meanwhile, the slurry type filler is used in the present invention unlike the related art, such that interfacial adhesion between the resin and the filler may be increased as compared to the case of using an existing general powder type filler, thereby making it possible to improve chemical resistance of the prepreg. That is, the slurry type filler according to the present invention is advantageous for improving dispersibility of the resin as compared to the powder type filler.

As used herein, the term "slurry type filler" may mean a suspension containing an inorganic filler dispersed in a state in which the in organic filler is dissolved in a solvent.

In addition, the present invention uses a relationship that the lower the benzoxazine resin, the higher the filler. In the case in which the slurry type filler is contained at a content of 160 to 350 parts by weight based on 100 parts by weight of the resin composition, the benzoxazine resin is contained at a content of 2 to 10 wt % based on the total weight of the entire resin composition. In this case, when the content of the slurry type filler is less than 160 parts by weight, at the time of pressing, the resin may flow and be separated from the filler, and when the content is more than 350 parts by weight, the filler may not be filled in glass fabric, such that a dry shape in which a surface of the glass fabric is exposed may be generated after pressing.

In addition, as the filler of the present invention, the slurry type inorganic filler may be preferably used. The slurry type inorganic filler may be prepared by a method known in the art, and the method is not particularly limited, but preferably, the slurry type inorganic filler may be prepared by a method of dispersing an inorganic filler in a solvent.

Preferably, as the slurry type filler, slurry containing at least one inorganic filler selected from the group consisting of silica, aluminum trihydrate, magnesium hydroxide, molybdenum oxide, zinc molybdate, zinc borate, zinc stannate, alumina, clay, kaolin, talc, calcined kaolin, calcined talc, mica, glass short fiber, glass fine powder, and hollow glass may be used. In addition, an average particle diameter (D50) of the filler is not particularly limited. For example, in view of dispersibility, it is preferable that the average particle diameter (D50) of the inorganic filler is 0.2 to 5 μm. Further, this filler may be surface-treated with epoxy silane. In the case of surface-treating the filler, the filler may be surface-treated by a wet/dry method using 0.3 to 1 part by weight of epoxy silane based on 100 parts by weight of the inorganic filler, and then used. In addition, the epoxy silane may have a weight average molecular weight of 200 to 400.

Meanwhile, the binder may contain the epoxy resin and the bismaleimide based resin. In this case, the binder may contain 20 to 80 wt % of the epoxy resin and 20 to 80 wt % of the bismaleimide based resin.

Further, the binder may further contain the cyanate based ester resin. In this case, the binder may contain 20 to 60 wt % of the epoxy resin, 30 to 70 wt % of the cyanate based ester resin, and 20 to 70 wt % of the bismaleimide based resin.

As the epoxy resin, any epoxy resin may be used as long as it is generally used in a thermosetting resin composition for a prepreg, and the kind of epoxy resin is not limited.

For example, as the epoxy resin, at least one selected from the group consisting of a bisphenol A type epoxy resin, a bisphenol F type epoxy resin, a bisphenol S type epoxy resin, a novolac type epoxy resin, a phenol novolac epoxy resin, a cresol novolac type epoxy resin, a tetraphenyl ethane type epoxy resin, a naphthalene type epoxy resin, a biphenyl type epoxy resin, and a dicyclopentadienyl type epoxy resin may be used.

In addition, as the special resin, the cyanate based ester resin and bismaleimide based resin may be used.

According to the present invention, the cyanate based ester resin was used together with the epoxy resin, such that physical properties of the resin may be improved. In addition, the cyanate based ester resin has a high glass transition temperature due to an increase in a crosslinking density, such that excellent thermal and electrical properties may be implemented.

The cyanate based ester resin may be at least one selected from the group consisting of bisphenol A type, bisphenol F type, bisphenol E type, bisphenol H type, bisphenol N type, phenol novolac type, and dicyclopentadiene bisphenol type cyanate based ester resins. Further, in consideration of flowability of the resin, it is preferable to use the cyanate based ester resin having a weight average molecular weight of 200 to 400.

In addition, the bismaleimide based resin may be at least one selected from the group consisting of a bismaleimide-triazine (BT) resin, 4,4'-bismaleimido-diphenylmethane, 1,4-bismaleimido-2-methylbenzene, or a mixture thereof; a modified bismaleimide resin including a Diels-Alder comonomer; 4,4'-bismaleimido-diphenylmethane and allylphenyl compound; and partially advanced bismaleimide using an aromatic amine as a substrate. In addition, the bismaleimide based resin may have a weight average molecular weight of 2,000 to 5,000.

In addition, the Diels-Alder comonomer may be selected from the group consisting of styrene and styrene derivatives, bis(propenylphenoxy) compounds, 4,4'-bis(propenylphenoxy)sulfone, 4,4'-bis(propenylphenoxy)benzophenone, and 4,4'-1-(1-methylethyllidene)bis(2-(2-propenyl)phenol).

More preferably, the bismaleimide based resin may be the bismaleimide triazine resin (hereinafter, 'BT'), or a mixture of 4,4'-bismaleimido-diphenylmethane and allylphenyl compound.

Further, the BT resin, which is a thermosetting resin capable of being used as an insulating layer of an electronic substrate requiring high performance and high integration, may have a weight average molecular weight of 2,000 to 5,000.

In addition, the binder ingredient, which is a mixture of the epoxy resin and the bismaleimide based resin, or a mixture of the epoxy resin, the cyanate based ester resin, and the bismaleimide based resin as described above, may be suitably adjusted in consideration of physical properties required as a binder so that a content of the entire resin mixture may be 100 wt %.

Meanwhile, the thermosetting resin composition according to an exemplary embodiment of the present invention may further contain at least one additive selected from the group consisting of a solvent, a curing accelerator, a dispersant, and silane coupling agent.

Specifically, according to the present invention, if necessary, the solvent may be added to the resin composition, such that the resin composition may be used as a solution. The kind of solvent is not particularly limited as long as it has excellent solubility to resin ingredients. That is, an alcohol-, ether-, ketone-, amide-, aromatic hydrocarbon-, ester-, or nitrile-based solvent, or the like, may be used alone, or a mixed solvent of at least two thereof may be used. In addition, a content of the solvent is not particularly limited as long as the resin composition may be impregnated into the glass fabric at the time of preparing the prepreg.

The curing accelerator may be used to accelerate the curing of the above-mentioned binder. The kind or mixed amount of curing accelerator is not particularly limited. For example, an imidazole based compound, tertiary amine, a quaternary ammonium salt, or the like, may be used, and at least two thereof may be used together with each other. Preferably, in the present invention, the imidazole based compound is used as the curing accelerator. In the case of using the imidazole based curing accelerator, a content of the curing accelerator may be about 0.1 to 1 part by weight based on 100 parts by weight of the binder. In addition, an example of the imidazole based curing accelerator includes imidazoles such as 1-methyl imidazole, 2-methyl imidazole, 2-ethyl 4-methyl imidazole, 2-phenyl imidazole, 2-cyclohexyl 4-methyl imidazole, 4-butyl 5-ethyl imidazole, 2-methyl 5-ethyl imidazole, 2-octhyl 4-hexyl imidazole, 2,5-dichloro-4-ethyl imidazole, 2-butoxy 4-allyl imidazole, and the like, and derivatives thereof. Particularly, 2-methyl imidazole or 2-phenyl imidazole is preferable due to excellent reaction stability and low cost.

In addition, if necessary, the thermosetting resin composition according to the present invention may further contain at least one additive selected from the group consisting of the generally added dispersant and silane coupling agent. Further, the resin composition according to the present invention may further contain various high polymer compounds such as other thermosetting resins, thermoplastic resins, and an oligomer and elastomer thereof, other flame retardant compounds, or additives as long as they do not damage inherent properties of the resin composition. These ingredients additionally contained in the resin composition are not particularly limited as long as they are generally used.

The thermosetting resin composition according to an exemplary embodiment of the present invention, containing these ingredients has a viscosity of 20 to 50 cps at a temperature of 20 to 35° C., such that flowability may be more excellent as compared to the existing thermosetting resin composition.

Meanwhile, according to another exemplary embodiment of the present invention, there is provided a prepreg prepared by impregnating the thermosetting resin composition into a fabric substrate.

The prepreg means a material in which the thermosetting resin composition is impregnated into the fabric substrate in a semi-cured state.

The kind of fabric substrate is not particularly limited, but a glass fabric substrate, a synthetic fabric substrate made of a woven or nonwoven fabric having, as a main ingredient, a polyamide-based resin fiber, such as a polyamide resin fiber, an aromatic polyamide resin fiber, or the like, a polyester-based resin fiber such as a polyester resin fiber, an aromatic polyester resin fiber, or a wholly aromatic polyester resin fiber, a polyimide resin fiber, or a fluororesin fiber, or the like, and a paper substrate having, as a main ingredient, craft paper, cotton linter paper, or mixed paper of linter and craft pulp may be used. Among them, the glass fabric substrate may be preferably used. The glass fabric substrate may improve strength of the prepreg and decrease water absorption and a coefficient of thermal expansion of the prepreg. A glass substrate used in the present invention may be selected from glass substrates used as materials for various printed circuit boards. Examples thereof may include glass fabric such as E glass, D glass, S glass, T glass, Q glass, L glass, and NE glass, but the present invention is not limited thereto. The glass substrate material may be selected according to the need, desired purpose, or performance. A form of the glass substrate is typically woven fabric, non-woven fabric, roving, a chopped strand mat, or a surfacing mat. A thickness of the glass substrate is not particularly limited, but a glass substrate having a thickness of about 0.01 to 0.3 mm, or the like may be used. Among the materials, a glass fiber material may be more preferable in view of strength and a water absorption property.

Further, in the present invention, a preparation method of the prepreg is not particularly limited, and the prepreg may be prepared by a method well known in the art. For example, as the preparation method of a prepreg, an impregnation method, a coating method using various coaters, a spraying method, or the like, may be used.

In the case of the impregnation method, the prepreg may be prepared by preparing varnish and then impregnating the fabric substrate with the varnish.

That is, preparation conditions of the prepreg are not particularly limited, but it is preferable that the thermosetting resin composition is used in a varnish state in which a solvent is added thereto. The solvent for resin varnish is not particularly limited as long as it may be mixed with the resin ingredient and have excellent solubility. A specific example thereof may include ketones such as acetone, methyl ethyl ketone, methyl isobutyl ketone, and cyclohexanone, aromatic hydrocarbons such as benzene, toluene, and xylene, amides such as dimethyl formamide and dimethylacetamide, aliphatic alcohols such as methylcellosolve, butylcellosolve, and the like.

In addition, it is preferable that at least 80 wt % of the used solvent is volatilized at the time of preparing the prepreg. Therefore, there is no limitation in the preparation method or drying conditions, or the like. At the time of drying, a temperature may be about 80 to 180° C., and a time is not particularly limited due to a balance with a gelation time of the varnish. In addition, it is preferable that the varnish is impregnated so that a resin solid content of the varnish becomes about 30 to 80 wt % based on a total amount of a resin solid content of the varnish and the substrate.

Meanwhile, according to another exemplary embodiment of the present invention, there is provided a metal clad laminate including the prepreg; and metal foil integrated with the prepreg by heating and pressurizing.

Preferably, the metal foil may be copper foil. The copper foil included in the copper clad laminate according to the present invention may be made of copper or a copper alloy. In this case, since the copper foil may be general copper foil in the art to which the present invention pertains, physical properties thereof are not particularly limited. However, according to the present invention, the copper foil of which a matt surface has a roughness Rz of 0.1 to 2.5 µm, preferably 0.2 to 2.0 µm, and more preferably 0.2 to 1.0 µm, and a thickness is 1 µm or more, preferably 2 to 18 µm may be applied.

In addition, at the time of heating the metal clad including the prepreg, since all resins are generally cured at about 200° C. or more, a laminating (press) maximum temperature may be about 200° C. or more, and generally about 220° C. Further, a pressure condition at the time of pressurizing the metal clad laminate is not particularly limited, but may be preferably about 35 to 50 kgf/cm$^2$.

At least one metal clad laminate including the prepreg prepared as described above may be laminated to thereby be used to manufacture a double-sided or multilayer printed circuit board. According to the present invention, the double-sided or multilayer printed circuit board may be manufactured by processing a circuit on the metal clad laminate, and the circuit may be processed by a method performed in a manufacturing process of a general double-sided or multilayer printed circuit board.

As described above, the present invention may be applied all printed circuit board various fields and preferably used to manufacture a printed circuit board for a semiconductor package by using the above-mentioned thermosetting resin composition.

Hereinafter, actions and effects of the present invention will be described in detail with reference to specific Examples of the present invention. However, the Examples are only for illustrative purposes and are not intended to limit the scope of the present invention.

Examples 1 to 2 and Comparative Examples 1 to 3

Thermosetting resin compositions in Examples and Comparative Examples were prepared by mixing ingredients with each other so as to have compositions and contents as shown in the following Table 1, respectively.

Resin varnish was prepared by mixing the thermosetting resin compositions with a filler, respectively, and then mixing the mixture in a high speed mixer.

Then, the resin varnish was impregnated into glass fabric (1078, manufactured by Nittobo, T-glass) having a thickness of 45 μm and then hot-air-dried at a temperature of 140° C., thereby preparing a prepreg.

In this case, each of the ingredients used to prepare the resin varnish was as follows:

Bismaleimide based resin (BMI-2300, manufactured by DAIWA); BT resin (Nanozine 600, manufactured by Nanokor); novolac type cyanate resin (PT-30S, manufactured by Lonza); naphthalene based epoxy resin (HP4710, manufactured by DIC Corp.); phenolphthalein based benzoxazine resin (XU8282, manufactured by Hunstman); epoxy silane treated slurry type silica (SC2050FNC, manufactured by Admatechs); powder type filler (SFP-30NHE, manufactured by Denka); provided that, a content of the resin ingredients in the following Tables 1 and 2 is based on wt % (sum: 100 wt %), and a content of silica is based on 100 parts by weight of the resin.

Thereafter, after two sheets of the prepreg prepared as described above were laminated, copper foil (thickness: 12 μm, manufactured by Mitsui) was positioned and laminated on both surfaces thereof and heated and pressurized at a temperature of 220° C. and a pressure of 50 kg/cm² for 75 minutes using a press, thereby manufacturing a copper clad laminate (thickness: 100 μm).

After etching the copper clad laminate manufactured as described above, basic physical properties and chemical resistance were tested.

TABLE 1

|  | Example 1 | Example 2 |
|---|---|---|
| Epoxy resin | 30 | 20 |
| Cyanate based ester resin | 40 | 0 |
| BT resin | — | 45 |
| BMT resin | 25 | 28 |
| Benzoxazine resin | 5 | 7 |
| Curing accelerator | 0.3 | 0.3 |

TABLE 1-continued

|  | Example 1 | Example 2 |
|---|---|---|
| Phenolic curing agent | — | — |
| Inorganic filler A | 180 | 180 |
| Inorganic filler B | — | — |

Note)
1) Epoxy resin: naphthalene based epoxy resin(HP4710, DIC)
2) BT resin: BT resin(Nanozine 600, Nanokor)
3) Cyanate based ester resin: novolac type cyanate resin(PT-30S, Lonza)
4) BMT resin: bismaleimide based resin(BMI-2300, DAIWA)
5) benzoxazine resin: phenolphthalene based benzoxazine resin(XU8282, Hunstman)
6) Curing accelerator: phenyl imidazole (2PZ, Shikoku)
7) Phenolic curing agent: cresol-novolac curing agent (GPX-41, Gifu Shellac)
8) Inorganic filler A: epoxy silane treated slurry type silica (SC2050FNC, Admatechs)
9) Inorganic filler B: powder type filler (SFP-30MHE, Denka)

TABLE 2

|  | Comparative Example 1 | Comparative Example 2 | Comparative Example 3 | Comparative Example 4 | Comparative Example 5 |
|---|---|---|---|---|---|
| Epoxy resin | 20 | 30 | 50 | 30 | 12 |
| Cyanate based ester resin | 35 | 40 | — | 40 | 16 |
| BT resin | — | — | — | 0 | — |
| BMT resin | 30 | 25 | 45 | 25 | 28 |
| Benzoxazine resin | 15 | 0 | 5 | 5 | 44 |
| Curing accelerator | — | — | 0.3 | — | 0.1 |
| Phenolic curing agent | — | 5 | — | — | — |
| Inorganic filler A | 180 | 180 | 180 | — | 80 |
| Inorganic filler B | — | — | — | 180 | — |

Note)
1) Epoxy resin: naphthalene based epoxy resin (HP4710, DIC)
2) BT resin: BT resin (Nanozine 600, Nanokor)
3) Cyanate based ester resin: novolac type cyanate resin (PT-30S, Lonza)
4) BMT resin: bismaleimide based resin (BMI-2300, DAIWA)
5) benzoxazine resin: phenolphthalene based benzoxazine resin (XU8282, Hunstman)
6) Curing accelerator: phenyl imidazole (2PZ, Shikoku)
7) Phenolic curing agent: cresol-novolac curing agent (GPX-41, Gifu Shellac)
8) Inorganic filler A: epoxy silane treated slurry type silica (SC2050FNC, Admatechs)
9) Inorganic filler B: powder type filler (SFP-30MHE, Denka)

Experimental Example

Evaluation of Physical Properties

Physical properties of the thermosetting resin compositions obtained in Examples and Comparative Examples were evaluated by the following methods.

1. Evaluation of Viscosity

In order to evaluate flowability of the resin, viscosities of the thermosetting resin compositions obtained in Examples and Comparative Examples were measured at a temperature of 25 using a Brookfield viscometer.

2. Evaluation of Physical Properties of Copper Clad Laminate

Physical properties of the copper clad laminates manufactured in Examples and Comparative Examples were evaluated by the following methods, and the results were shown in Tables 3 and 4.

(a) Evaluation of Chemical Resistance

In desmear evaluation, an atmosphere of the entire process conditions was alkaline, and processes were performed in a sequence of a swelling process, a permanganate process, and a neutralizing process. As a solvent, an available solution manufactured by Atotech was used.

Chemical resistance was evaluated by etching to remove the copper foil of the copper clad laminate and then measuring a difference (etching rate) in a weight of the sample before and after a desmear process.

(b) Glass Transition Temperature

After etching to remove the copper foil of the copper clad laminate, a glass transition temperature was measured at a heating rate of 5° C./min by dynamic mechanical analysis (DMA).

After etching to remove the copper foil of the copper clad laminate, a glass transition temperature was measured at a heating rate of 10° C./min by thermo mechanical analysis (TMA).

(c) Elastic Modulus

After etching to remove the copper foil of the copper clad laminate, an elastic modulus was measured at 30° C. and 260° C. at a heating rate of 5° C./min by dynamic mechanical analysis (DMA).

(d) Coefficient of Thermal Expansion (CTE)

After etching to remove the copper foil of the copper clad laminate, a coefficient of thermal expansion (CTE) was measured at a heating rate of 10° C./min by thermo mechanical analysis (TMA).

(e) Water Absorption

After etching to remove the copper foil of the copper clad laminate, water absorption was measured using a thermo-hygrostat under 85° C./85% conditions.

(f) Evaluation of Adhesion (Peel Strength)

Peel strength of a section (width: 1 cm) of the copper clad laminate was evaluated using a texture analyzer.

TABLE 3

|  | Example 1 | Example 2 | Comparative Example 1 |
|---|---|---|---|
| Viscosity (25° C., cps) | 40 | 40 | 70 |
| Desmear (g/50 cm²) | 0.003 | 0.004 | 0.01 |
| Glass transition temperature (DMA) (° C.) | 300 | 300 | 290 |
| Glass transition temperature (TMA) (° C.) | 270 | 270 | 250 |
| Elastic modulus (30/260° C.) (GPa) | 28/24 | 28/24 | 26/22 |
| X/Y CTE (50-150° C.) (ppm/° C.) | 4 | 4 | 4 |
| Water absorption (%) | 0.2 | 0.2 | 0.4 |
| Peel strength (kfg/cm) | 0.7 | 0.68 | 0.6 |

TABLE 4

|  | Comparative Example 2 | Comparative Example 3 | Comparative Example 4 | Comparative Example 5 |
|---|---|---|---|---|
| Viscosity (25° C., cps) | 50 | 40 | 40 | 500 |
| Desmear (g/50 cm²) | 0.015 | 0.01 | 0.015 | 0.013 |
| Glass transition temperature (DMA) (° C.) | 300 | 280 | 300 | 290 |
| Glass transition temperature (TMA) (° C.) | 260 | 245 | 270 | 260 |
| Elastic modulus (30/260° C.) (GPa) | 27/23 | 26/22 | 28/24 | 22/19 |
| X/Y CTE (50-150° C.) (ppm/° C.) | 5 | 5 | 4 | 7 |
| Water absorption (%) | 0.4 | 0.35 | 0.4 | 0.4 |
| Peel strength (kfg/cm) | 0.65 | 0.6 | 0.65 | 0.6 |

As shown in the results of Tables 3 and 4, in Examples of the present invention, benzoxazine resin was used at a content of 10 parts by weight or less based on 100 parts by weight of the binder, and the slurry type filler was used, such that dispersibility of the resin was improved as compared to Comparative Examples. Therefore, it may be confirmed that in the case of the present invention, more excellent chemical resistance and adhesion force, and high grass transition temperature may be implemented as compared to Comparative Examples.

Although the present invention has been described in detail based on particular features thereof, and it is obvious to those skilled in the art that these specific technologies are merely preferable embodiments and thus the scope of the present invention is not limited to the embodiments. Therefore, the substantial scope of the present invention is defined by the accompanying claims and equivalent thereof.

The invention claimed is:

1. A thermosetting resin composition for a semiconductor package comprising:
   a binder, a slurry filler and a curing accelerator,
   wherein the binder contains 20 to 30 wt % of a naphthalene epoxy resin, 25 to 73 wt % of a bismaleimide resin, and 5 to 7 wt % of a benzoxazine resin based on a total weight of the binder,
   wherein the thermosetting resin composition has a viscosity of 20 to 50 cps at a temperature of 20 to 35° C.,
   wherein the thermosetting resin composition does not include a phenolic curing agent,
   wherein the bismaleimide resin includes 4,4'-bismaleimido-diphenylmethane or a mixture of a bismaleimide-triazine resin and 4,4'-bismaleimido-diphenylmethane, and
   wherein the curing accelerator is contained in an amount of 0.1 to 1 part by weight based on 100 parts by weight of the binder,
   wherein the slurry filler comprises an epoxy silane-modified silica dispersed in a solvent,
   wherein the benzoxazine resin is 3,3-bis(3-phenyl-2,4-dihydro-1,3-benzoxazin-6-yl)-2-benzofuran-1-one,
   wherein the slurry filler is contained at a content of 180 to 350 parts by weight based on 100 parts by weight of the binder, and wherein the epoxy silane-modified silica is contained at a content of 126 to 245 parts by weight based on 100 parts by weight of the binder.

2. The thermosetting resin composition of claim 1, wherein the binder further contains a phenol novolac cyanate based ester resin, and wherein the cyanate based ester resin has a weight average molecular weight of 200 to 400.

3. The thermosetting resin composition of claim 2, wherein the binder contains 30 to 40 wt % of the cyanate based ester resin.

4. The thermosetting resin composition of claim 1, further comprising at least one additive selected from the group consisting of an additional solvent, a dispersant, and a silane coupling agent.

5. The thermosetting resin composition of claim 1, further comprising a modified bismaleimide resin including a Diels-Alder comonomer selected from the group consisting of styrene and styrene derivatives, bis(propenylphenoxy) compounds, 4,4'bis(propenylphenoxy)sulfone, 4,4'-bis(propenylphenoxy)benzophenone, and 4,4'-1-(1-methylethylidene)bis(2-(2-propenyl)phenol).

6. A prepreg prepared by impregnating the thermosetting resin composition of claim 1 into a fabric substrate.

7. A metal clad laminate comprising:
   the prepreg of claim 6; and
   metal foil integrated with the prepreg by heating and pressurizing.

8. A method of preparing a multilayer printed circuit board for a semiconductor package, comprising:
   applying a resin varnish to a substrate to form a prepreg;
   integrating a metal foil with the prepreg by heating and pressurizing to form a metal clad laminate; and
   processing a circuit on the metal clad laminate to form the multilayer printed circuit board,
   wherein the resin varnish is the thermosetting resin composition of claim 1.

* * * * *